(12) United States Patent
Hioki

(10) Patent No.: US 6,359,811 B1
(45) Date of Patent: Mar. 19, 2002

(54) SEMICONDUCTOR INTEGRATED CIRCUIT WITH RANDOM ACCESS MEMORY TESTING

(75) Inventor: Osamu Hioki, Tottori-ken (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/721,932

(22) Filed: Nov. 27, 2000

(30) Foreign Application Priority Data

Nov. 30, 1999 (JP) .......................................... 11-340924
Aug. 25, 2000 (JP) ....................................... 2000-254763

(51) Int. Cl.⁷ ............................................. G11C 16/04
(52) U.S. Cl. ........................ 365/189.04; 365/189.01; 365/201
(58) Field of Search ................... 365/189.04, 189.01, 365/201, 233, 191, 189.08

(56) References Cited

U.S. PATENT DOCUMENTS 6,067,256 A * 5/2000 Yamashita et al. ...... 365/189.04
6,166,989 A * 12/2000 Hamamoto et al. ......... 365/233
6,219,300 B1 * 4/2001 Tamaki ....................... 365/233

FOREIGN PATENT DOCUMENTS

JP            405006690     * 1/1993    ........... G11C/29/00

* cited by examiner

*Primary Examiner*—David Nelms
*Assistant Examiner*—David Lam
(74) *Attorney, Agent, or Firm*—Oliff & Berridge, PLC

(57) ABSTRACT

An input/output control circuit writes data from a data bus in a RAM and reads out stored data in the RAM. A reading circuit is provided independently of the input/output control circuit for each of the memory cell columns. The reading circuit reads out data stored in each of the memory cell columns and outputs to a specified output terminal. A switching circuit switches between a reading operation of reading the stored data by the input/output control circuit and a reading operation of reading the stored data by the reading device. In a test mode, the stored data may be read out by the reading devices. As a result, the stored data in the RAM can be read in the unit of the number of the output terminals. Accordingly, the time required for reading out the stored data is shortened compared to the case in which the stored data is read out through the data bus.

5 Claims, 2 Drawing Sheets

SEMICONDUCTOR INTEGRATED CIRCUIT WITH RANDOM ACCESS MEMORY TESTING

BACKGROUND OF THE INVENTION

1. Field of Invention

The present invention relates to a semiconductor integrated circuit, and more particularly, a semiconductor integrated circuit having a RAM built therein, such as, for example, a single chip microcomputer.

2. Description of Related Art

Typically, a RAM built in a semiconductor integrated circuit such as a single chip microcomputer transfers and receives signals to and from a central processing unit through a data bus. In other words, as shown in FIG. 2, for example, a RAM has columns or rows of memory cells defining memory cell columns ML1, ML2 ... MLn that are connected to a data bus DB through input/output control circuits 2 provided for the respective memory cell columns ML1, ML2 ... MLn. An input/output control circuit 2 is formed from two three-state circuits for writing and reading operations that are connected to one another in mutually inverse directions.

The data bus DB connects to the central processing unit (not shown). Each of the input/output control circuits 2 operates according to a logical sum of a writing command signal WR or a reading command signal RD and an enable signal CE1, CE2, ... CEn provided from the central processing unit. The central processing unit controls the enable signals CE1, CE2 ... CEn, and switches the enable signals CE1, CE2, ... CEn set at an "H" level depending on the memory regions to be accessed. When the writing command signal WR is at an "H" level, those of the memory cell columns with the enable signal being at the "H" level become effective, and data from the central processing unit are transferred through the data bus DB and the input/output control circuits 2 and written in designated memory cells in the effective memory cell columns ML1, ML2 ... MLn. Similarly, when the reading command signal RD is at an "H" level, those of the memory cell columns with the enable signal being at the "H" level become effective, and data stored in designated memory cells are transferred through those of the input/output control circuits 2 corresponding to the effective memory cell columns, and through the data bus DB to the central processing unit.

When the RAM is tested, test data is transferred from the central processing unit through the data bus DB and written in specified addresses in the RAM. Then, for the test of the RAM, the data stored in the specified addresses are read out onto the data bus DB and compared with the test data that is written, to thereby observe the status of the stored data that is read out.

SUMMARY OF THE INVENTION

Since the RAM is accessed through the central processing unit and the data bus DB, the number of the memory cells in which data can be simultaneously written is limited. Similarly, when stored data is read from the memory cell columns ML1, ML2, ... MLn, the number of data that can be simultaneously read out is limited.

Although the number of data that can be simultaneously written or read is limited, the user may not feel that the processing time required for such operations is very long. The processing time required for writing or reading data is relatively short compared with the operation time that is spent by the user, and therefore does not make the user feel inconvenient and does not present any problems to the user. However, when operation tests are conducted on semiconductor integrated circuits before shipping, test data are written in all addresses in each of the semiconductor integrated circuits, and then the stored data is read from all of the addresses. Accordingly, the processing time for writing or reading the data is relatively long with respect to the overall test time. In other words, the fact that the number of data that can be simultaneously written or read is limited poses a major obstacle to an effort in shortening the test time.

To avoid such an obstacle, a RAM may be divided into a plurality of blocks. Test data can be simultaneously written in a plurality of addresses. However, when data stored in the RAM is read, the read data may collide with one another on the data bus. Therefore, it is difficult to simultaneously read the stored data.

Therefore, the present invention has been made at least in view of the unsolved problems of the conventional technique, and an object of the present invention is to provide a semiconductor integrated circuit that can readily perform a test on RAMs mounted therein.

A semiconductor integrated circuit according to an exemplary embodiment of the present invention, in which data stored in a storage region is read through a data bus, may consist of a first reading device that is interposed between the storage region and the data bus and that reads out data stored in the storage region, a second reading device that reads out data stored in the storage region independently of the first reading device and that outputs to an individual output terminal provided for the respective stored data, and a switching device that switches in response to a mode-switching signal between reading of the stored data by the first reading device and reading of the stored data by the second reading device.

According to this exemplary embodiment of the present invention, the first reading device is provided between the storage region and the data bus, and stored data is read by the first reading device from the storage region onto the data bus. Furthermore, the second reading device reads out data stored in the storage region independently of the first reading device and outputs the data to each of the individual output terminals provided for the respective stored data. Also, the switching device switches in response to a mode-switching signal between reading of the stored data by the first reading device and reading of the stored data by the second reading device.

In other words, the stored data read out by the second reading device is outputted to each of the individual output terminals provided for the respective stored data. Therefore, for example, the stored data may be read out in the unit of the number of the output terminals. As a result, the stored data can be retrieved in the unit of the number of the output terminals without the plural stored data being collided.

It is noted that, when the stored data is read through the data bus, the number of the data that can be read is limited due to the bit number of the data bus or the like. This does not pose any problems in the normal use of the semiconductor integrated circuit. However, when an operation test is conducted on the semiconductor integrated circuit, test data is written in the storage region, and then the stored data is read from the storage region to observe the stored data. Therefore, it takes a long time for reading the stored data alone.

In this case, the switching device switches from an operation of reading the stored data through the data bus by the first reading device to an operation of reading the stored data by the second reading device, such that a plurality of stored data are read out to the output terminals. As a result, the stored data can be read in the unit of the number of the output terminals, and thus the time required for reading out the stored data can be shortened.

Also, in accordance with another exemplary embodiment, the semiconductor integrated circuit may further consist of an output terminal for outputting a signal that is different from the stored data read out by the second reading device, wherein the output terminal is commonly used for outputting the stored data read out by the second reading device.

In accordance with the present invention set forth this exemplary embodiment, an output terminal provided for outputting a signal that is different from the stored data read out by the second reading device is commonly used for outputting the stored data read out by the second reading device. Accordingly, an independent output terminal does not need to be provided for outputting stored data read by the second reading device.

In another exemplary embodiment in the semiconductor integrated circuit, the second reading device is structured in a manner that a plurality of stored data can be simultaneously read out.

In accordance with the present invention set forth in this exemplary embodiment, the second reading device simultaneously reads a plurality of stored data, and outputs the stored data to the individual output terminals. Accordingly, a plurality of stored data can be simultaneously retrieved from the output terminals.

For example, when memory cells are disposed in a matrix to form a storage region, and the first reading device reads and writes data in and from each of memory cell columns in the matrix, stored data is read from the memory cells one by one in each of the memory cell columns, and is outputted to each of the respective individual output terminals. As a result, the stored data can be read out in the unit of the number of the memory cell columns.

In another exemplary embodiment, in the semiconductor integrated circuit, the second reading device successively outputs a plurality of stored data to a common output terminal at different timings.

In accordance with the present invention set forth in this exemplary embodiment, a plurality of stored data are outputted to a common output terminal, and the plurality of the stored data are successively outputted at different timings. Therefore, even when the number of the output terminals that can be commonly used is smaller than the number of the stored data to be retrieved from the output terminals, the stored data can be successively outputted to the common output terminal at different timings, i.e., at timings that allow retrieving the stored data from the common output terminal. As a result, a plurality of the stored data can be retrieved without the data being collided with one another.

A semiconductor integrated circuit according to another exemplary embodiment of the present invention, in which data stored in a storage region is read through a data bus, may consist of a plurality of writing devices that are capable of writing data via the data bus in specified regions of the storage region, and a write control device that operates any one of the writing devices and switches the writing devices to be operated from one to the other to thereby control writing data in the storage region, wherein the write control device operates the plurality of the writing devices to simultaneously perform writing operations in a test mode.

In accordance with the present invention set forth in this exemplary embodiment, the plurality of writing devices capable of writing data via the data bus in specified regions of the storage region are provided between the storage region and the data bus. The write control device controls the writing devices, and successively switches the writing devices to be operated from one to the other, such that data provided through the data but are written in specified regions of the storage region through the writing devices that are operated by the write control device. The writing devices are switched from one to the other, such that the data are successively written in specified regions of the storage region.

In a test mode, the write control device operates the plurality of writing devices to simultaneously write data in a plurality of regions. Accordingly, for example, when test data is written in various areas of the storage region to conduct an operation test on the semiconductor integrated circuit, the writing devices are switched to the test mode in which the writing devices simultaneously operate, such that the test data from the data bus are written in the specified areas of the storage region through the respective corresponding writing devices. Accordingly, data can be written in the storage area in the unit of the number of the writing devices, and therefore the time required for writing test data can be shortened.

DETAILED DESCRIPTION OF PREFERRED EMBODIMENTS

An exemplary embodiment of the present invention is described below with reference to the accompanying drawings.

Figure 1:
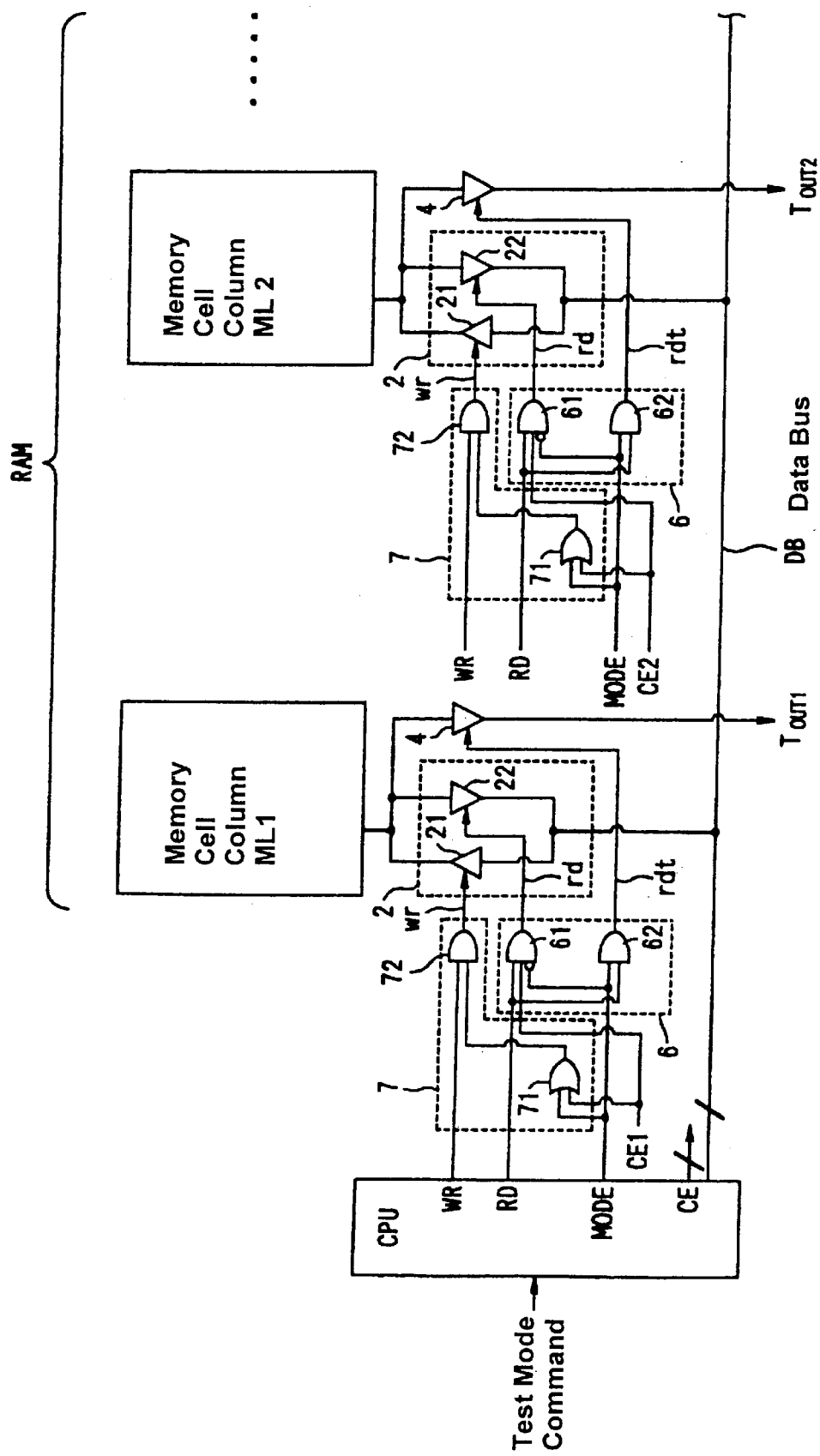
FIG. 1 schematically shows a diagram of a semiconductor integrated circuit in accordance with one exemplary embodiment of the present invention.
Figure 2:
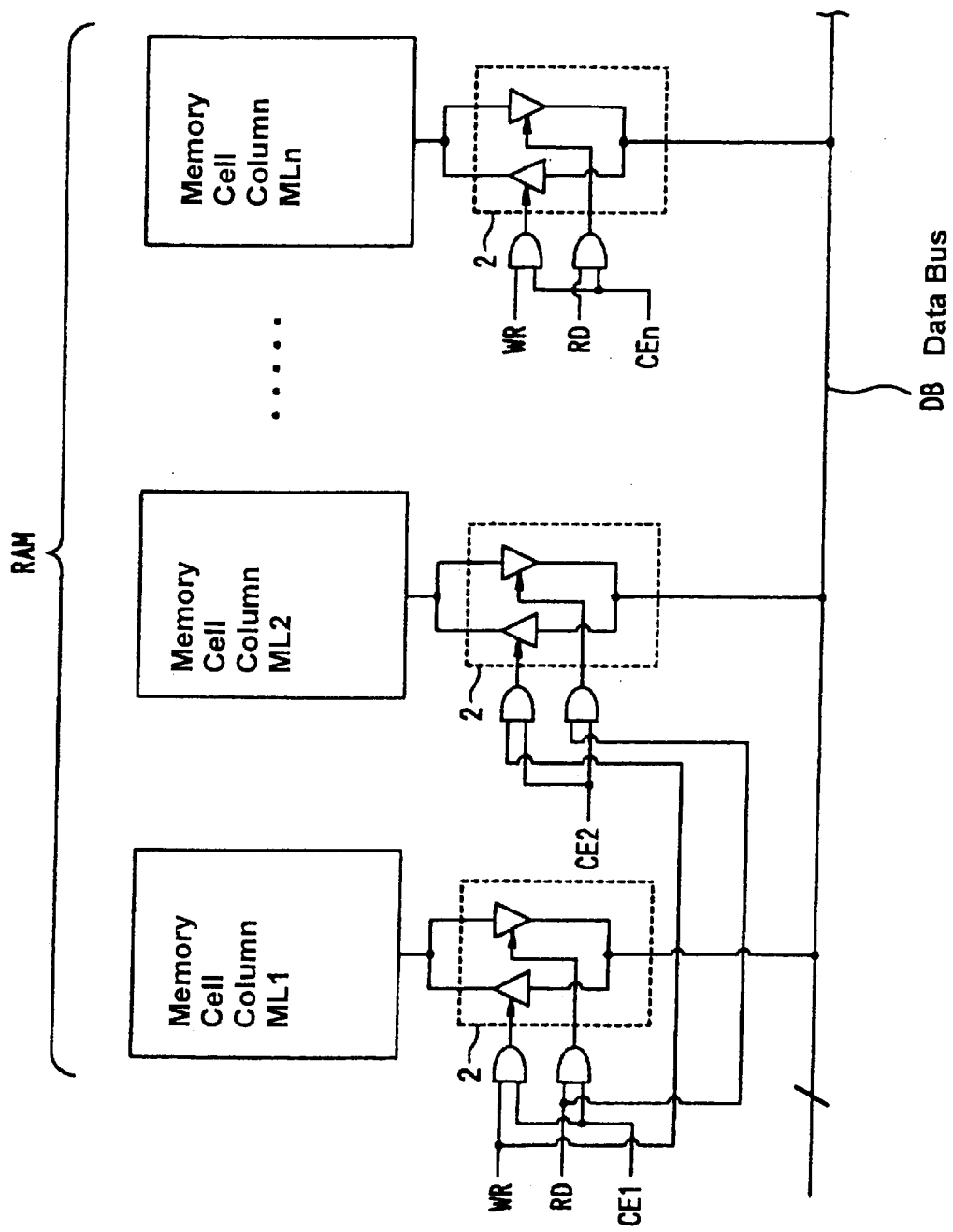
FIG. 2 schematically shows a diagram of a conventional semiconductor integrated circuit.

FIG. 1 schematically shows a diagram of a RAM in accordance with one exemplary embodiment of the present invention that is built in an integrated circuit (IC), such as, for example, a single microchip computer.

As shown in FIG. 1, the RAM has a plurality of memory cells disposed in a matrix in a similar manner as an ordinary RAM, and an input/output control circuit 2 provided for each of memory cell columns ML1, ML2, . . . , that are respectively composed of the memory cells arranged in a width direction or in a length direction. Each of the memory cell columns ML1, ML2, . . . is connected to a data bus DB through a corresponding one of the input/output control circuits 2. The data bus DB is connected to a central processing unit CPU, such that data from the central processing unit CPU is transferred through the data bus DB and the input/output control circuits 2 and written in the RAM, and data stored in the RAM is read out through the input/output control circuits 2 and the data bus DB and transferred to the central processing unit CPU.

Also, each of the memory cell columns ML1, ML2, . . . is provided with a reading circuit (second reading device) 4 that is formed from, for example, a three state circuit, for reading out stored data from the memory cell column ML1, ML2, . . . independently of the input/output control circuit 2. Outputs from the reading circuits 4 are independently provided to output terminals $T_{OUT1}$, $T_{OUT2}$, . . . of the integrated circuit. The output terminals $T_{OUT}$ are not particularly provided for outputting stored data from the reading circuits 4, but are provided as terminals that are pre-installed in the integrated circuit for outputting other data. In other words, the reading circuit 4 outputs stored data through an output terminal that is provided for outputting other data.

A switching circuit (switching device) 6 switches between a reading operation for reading stored data by the reading circuit 4 and a reading operation for reading stored data by the input/output control circuit 2. Furthermore, a write control circuit 7 is provided to control the operation of the input/output control circuit 2 at the time of writing data according to a mode-switching signal.

The switching circuit 6 and the writing control circuit 7 are provided for each of the memory cell columns ML1, ML2, . . .

An input/output control circuit 2 includes a writing circuit (writing device) 21 and a reading circuit (first reading device) 22 that are respectively formed from two three-state circuits connected to each other in mutually inverse directions. A writing command signal wr from the write control circuit (write control device) 7 is inputted in a control signal input terminal of the writing circuit 21. A reading command signal rd from the switching circuit 6 is inputted in a control signal input terminal of the reading circuit 22. When the writing command signal wr is at an "H" level, the writing circuit 21 becomes effective, and data is transferred from the data bus DB to the memory cell column ML1, ML2, . . . through the writing circuit 21. On the other hand, when the reading command signal rd is at an "H" level, the reading circuit 22 becomes effective, and data stored in the memory cell column ML1, ML2, . . . is outputted to the data bus DB through the reading circuit 22.

The switching circuit 6 is composed of two AND circuits 61 and 62. A reading command signal RD, an inverted signal of a mode-switching signal MODE and an enable signal CE1, CE2, . . . from the central processing unit CPU are inputted in the AND circuit 61. The AND circuit 61 provides an output as a reading command signal rd to the control signal input terminal of the writing circuit 22 of the input/output control circuit 2. A reading command signal RD and the mode-switching signal MODE from the central processing unit CPU are inputted in the AND circuit 62. The AND circuit 62 provides an output as a reading command signal rdt to the control signal input terminal of the three-state circuit that composes the reading circuit 4.

The writing control circuit 7 is formed from an OR circuit 71 that takes a logical product of the mode-switching signal MODE and the enable signal CE1, CE2, . . . provided from the central processing unit CPU, and an AND circuit 72 that takes a logical sum of an output from the OR circuit 71 and the writing command signal WR from the central processing unit CPU. The AND circuit 72 provides an output as a reading command signal wr to the control signal input terminal of the writing circuit 21.

Furthermore, the central processing unit CPU controls word lines (not shown) in a similar manner as they are controlled in an ordinary RAM. The central processing unit CPU also controls bit lines (not shown) with the writing command signal WR, the reading command signal RD and the enable signal CE. In other words, when a writing operation is executed, the writing command signal WR is set at an "H" level; and when a reading operation is executed, the reading command signal RD is set at an "H" level. Furthermore, one of the enable signals CE1, CE2, . . . provided to the memory cell columns ML1, ML2, . . . is set to an "H" level, and the enable signals at the "H" level are switched from one to the other at specified timings. By the operations described above, data that is transferred through the data bus DB is written through the input/output control circuit 2 in specified memory cells of the RAM, or data stored in the RAM is read and outputted to the data bus DB. When a test mode is designated by an upper level computer (not shown), the central processing unit CPU sets the mode-switching signal MODE to an "H" level that indicates a test mode, and outputs the same. When the test mode is not designated, the central processing unit CPU sets the mode-switching signal MODE to an "L" level that indicates a normal mode and outputs the same.

Next, an operation of the exemplary embodiment described above is described.

Let us assume that the RAM is tested in an operation test or the like that is conducted before the integrated circuit IC is shipped out from factory. First, specified test data is written in the RAM.

The central processing unit CPU sets the mode-switching signal MODE at an "H" level that indicates a test mode and outputs the same, and also outputs a writing command signal WR at an "H" level. The central processing unit CPU designates addresses, in a similar manner as may be conducted in writing data in an ordinary RAM, and performs a writing control by successively switching the enable signals CE1, CE2, . . . from one to the other to thereby control the word lines and the bit lines.

Since the mode-switching signal MODE is at the "H" level, the OR circuit 71 of the writing control circuit 7 provides an output at an "H" level. Also, since the writing command signal WR is at the "H" level, the writing command signal wr from the writing control circuit 7 is at an "H" level. As a consequence, the writing circuit 21 of the input/output control circuit 2 is placed in an ON state, data on the data bus DB is transferred through the writing circuit 21 to the memory cell columns ML1, ML2, . . . , and written in specified ones of the memory cells. In this instance, because the mode-switching signal MODE is at the "H" level, and the output of the OR circuit 71 is at the "H" level without regard to the enable signal CE1, CE2, . . . , all of the writing command signals wr that are outputs of all of writing control circuits 7 are at the "H" level. As a result, the writing circuits 21 of all of the input/output control circuits 2 are turned on, data from the data bus DB are simultaneously transferred to the memory cell columns ML1, ML2, . . . , and the word lines are controlled such that specified ones of the memory cells are selected to write the data. In this case, the data can be simultaneously written in the memory cell columns ML1, ML2, . . . As a result, the time required for writing the data is substantially shortened compared to the case in which the data is written by switching the enable signals CE1, In this manner, the data is written in the entire memory cells. Then, a test probe is connected to each of the output terminals $T_{OUT1}$, $T_{OUT2}$, . . . of the respective corresponding memory cell columns ML1, ML2, . . . , and the upper level computer instructs the central processing unit CPU to continuously conduct the test mode.

As a result, the mode-switching signal MODE is maintained at an "H" level that indicates a test mode. The reading command signal RD at an "H" level is outputted, the enable signals CE1, CE2, . . . at the "H" level are switched from one to the other at specified timings and outputted, and the word lines are controlled, such that the data stored in the memory cells of the memory cell columns ML1, ML2, . . . are successively read out.

In this instance, since the mode-switching signal MODE is set at an "H" level, the AND circuit 62 of the switching circuit 6 becomes effective, and the reading command signal rdt becomes to be at an "H" level, with the result that the reading circuit 4 becomes to be effective. Also, since the reading command signal rd is maintained at an "H" level, the output of the AND circuit 61 is maintained at an "L" level, and the reading circuit 22 is maintained in an OFF state.

As a result, the stored data that are read out from the memory cell columns ML1, ML2, . . . are outputted through the reading circuits 4 to the output terminals $T_{OUT1}$, $T_{OUT2}$, . . . In this instance, since the reading command signal RD is at an "H" level, all of the reading circuits 4 of the corresponding respective memory cell columns ML1, ML2, . . . become to be effective without regard to the enable signal CE1, CE2, . . . , such that the stored data are outputted from all of the memory cell columns ML1, ML2, . . . to the corresponding respective output terminals $T_{OUT1}$, $T_{OUT2}$. . .

By controlling the word lines, the data stored in the memory cells of the memory cell columns ML1, ML2, . . . are successively read out. More specifically, the data stored in the memory cells in each of the memory cell columns ML1, ML2, . . . are successively read out and then outputted from the output terminals $T_{OUT1}$, $T_{OUT2}$, . . . In this instance, the test probe is connected to each of the output terminals $T_{OUT1}$, $T_{OUT2}$. . . Accordingly, output signals from the output terminals $T_{OUT1}$, $T_{OUT2}$, . . . may be observed to check the data stored the memory cells in each of the memory cell columns ML1, ML2, . . .

On the other hand, when the semiconductor integrated circuit is under a normal use condition, the upper level computer unit does not instruct the central processing unit CPU to execute a test mode. Accordingly, the mode-switching signal MODE is set to an "L" level that indicates a normal mode. The central processing unit CPU controls the word lines and the bit lines in a similar manner as they are controlled in an ordinary RAM. In this instance, since the mode-switching signal MODE is at the "L" level, at the time of the writing operation, the writing circuit 21 operates at the timing when the enable signal CE1, CE2, . . . becomes to be at an "H" level, and the data on the data bus DB is written in designated ones of the memory cells. On the other hand, at the time of the reading operation, since the mode-switching signal MODE is at an "L" level, the reading command signal rd becomes to be an "H" level at the timing when the enable signal CE1, CE2, . . . becomes to be at an "H" level, and the reading command signal rdt is maintained at an "L" level.

Accordingly, the reading circuit 22 is placed in an ON state at the timings of the enable signal CE1, CE2, . . . , and the reading circuit 4 is maintained to be in an OFF state. Therefore, the operating reading circuit 22 switches at the timings of the enable signal CE1, CE2, . . . to read out data from the memory cells, and the read data are outputted through the reading circuit 22 to the data bus DB and transferred to the central processing unit CPU.

If the central processing unit CPU reads out data from the RAM through the data bus DB that is generally a four-bit bus or an eight-bit bus, the number of the memory cells MS that can be simultaneously read is limited, and therefore the reading operations need to be repeated in order to read out the data stored in the entire memory cells MS.

However, in the embodiment described above, the stored data in the memory cell columns ML1, ML2, . . . can be simultaneously read out at the corresponding respective output terminals $T_{OUT1}$, $T_{OUT2}$, . . . In other words, the stored data in the memory cell columns ML1, ML2, . . . can be read out in the unit of the number of the output terminals $T_{OUT1}$, $T_{OUT2}$. . .

As a consequence, the time required for reading out the stored data from the RAM is substantially shorter as compared with the case in which the central processing unit CPU reads the stored data through the data bus DB.

It is noted that the output terminals $T_{OUT1}$, $T_{OUT2}$. . . are pre-installed in the semiconductor integrated circuit for outputting other data, and the output terminals $T_{OUT1}$, $T_{OUT2}$, . . . are commonly used as test terminals for conducting tests. Accordingly, the invention is realized without installing additional test output terminals $T_{OUT1}$, $T_{OUT2}$, . . . Also, a semiconductor integrated circuit of the present invention can be realized without substantial modifications to a conventional semiconductor integrated circuit because this can be achieved by adding the reading circuit 4, the switching circuit 6 and the writing control circuit 7 to a conventional semiconductor integrated circuit.

It is noted that, in the exemplary embodiment described above, the output terminal $T_{OUT1}$, $T_{OUT2}$, . . . is provided for each of the memory cell columns ML1, ML2, . . . However, the present invention is not limited to this particular embodiment. For example, when commonly usable output terminals are not provided for all of the memory cell columns ML1, ML2, . . . , outputs from a plurality of memory cell columns ML1, ML2, . . . may be provided to one of the output terminals $T_{OUT1}$, $T_{OUT2}$, . . . In this case, stored data from the memory cell columns ML1, ML2, . . . , which are to be outputted to the same output terminal $T_{OUT1}$, $T_{OUT2}$, . . . , may be outputted to the output terminal $T_{OUT1}$, $T_{OUT2}$, . . . at different timings. In other words, for example, the data stored in the memory cell columns ML1, ML2, . . . , which are to be outputted to the same output terminal $T_{OUT1}$, $T_{OUT2}$, . . . , may be read out from the memory cell columns ML1, ML2, . . . at different timings. Alternatively, the stored data may be simultaneously read form the memory cell columns ML1, ML2, . . . and temporarily retained somewhere, and the retained data may be outputted to the output terminal $T_{OUT1}$, $T_{OUT2}$, . . . at different timings.

Also, in the exemplary embodiment described above, the stored data are read out in the unit of the memory cells that are arranged in the width direction. However, the present invention is not limited to this particular embodiment. For example, the stored data may be read out in the unit of the memory cells that are arranged in a length direction.

As described above, in a semiconductor integrated circuit in accordance with an exemplary embodiment of the present invention, a first reading device is provided between a data bus and a storage region, and a second reading device is provided independently of the first reading device, wherein stored data in the storage region are read out through the second reading device and outputted to individual output terminals that are provided for the corresponding respective stored data. As a result, when the semiconductor integrated circuit is tested, the data stored in the storage region can be read out through the second reading device in the unit of the number of the output terminals. As a result, the processing time required for reading out the data stored in the storage region can be shortened.

Also, in accordance with another exemplary embodiment, in the semiconductor integrated circuit, output terminals for outputting other signals are commonly used as output terminals for outputting stored data that are read out by the second reading device. Accordingly, the invention is readily realized without installing additional output terminals for outputting stored data read out by the second reading device.

Furthermore, in accordance with another exemplary embodiment, in the semiconductor integrated circuit, the second reading device is formed in a manner that a plurality of stored data can be simultaneously read out. As a result, a plurality of stored data can be simultaneously retrieved from a plurality of output terminals.

Also, in accordance with another exemplary embodiment of the present invention, a plurality of stored data are successively outputted to a common output terminal at different timings. As a result, when the number of commonly usable output terminals is less than the number of data to be read out, a plurality of stored data can be securely retrieved from the output terminals.

Also, in accordance with another exemplary embodiment of the present invention, a plurality of writing devices are provided between a storage region and a data bus. In a normal operation mode, the plurality of writing devices are successively switched for a writing operation. However, in a test mode, the plurality of writing devices are simultaneously operated for a writing operation. As a result, data can be written in the storage region in the unit of the number of the writing devices. Therefore, when common test data are written in various areas in the storage region, the time required for writing the test data is shortened.

What is claimed is:

1. A semiconductor integrated circuit in which data stored in a storage region is read through a data bus, the semiconductor integrated circuit comprising:

a first reading device interposed between the storage region and the data bus and that reads out data stored in the storage region;

a second reading device that reads out data stored in the storage region independently of the first reading device, and that outputs the read out data to an individual output terminal provided for the stored data in a test mode; and a switching device responsive to a mode-switching signal to switch between a reading of the stored data by the first reading device and a reading of the stored data by the second reading device.

2. The semiconductor integrated circuit according to claim 1, the individual output terminal is used as outputting a signal data, that is different from the stored data read out by the second reading device, in a normal mode.

3. The semiconductor integrated circuit according to claim 1, the second reading device simultaneously reading a plurality of stored data.

4. The semiconductor integrated circuit according to claim 1, the second reading device successively outputting a plurality of stored data to a common output terminal at different timings.

5. The semiconductor integrated circuit of claim 1, the semiconductor integrated circuit comprising:

a plurality of writing devices that write data provided via the data bus in specified regions of the storage region; and a write control device that in a non-test mode operates a selected one of the writing devices and switches the selected writing device to be operated from the selected writing device to another writing device to thereby control writing data in the storage region by switching the writing devices to be operated, and where the write control device operates the plurality of writing devices to simultaneously perform writing operations in the test mode.

* * * * *